(12) United States Patent
Wong et al.

(10) Patent No.: US 7,944,773 B2
(45) Date of Patent: May 17, 2011

(54) SYNCHRONOUS COMMAND-BASED WRITE RECOVERY TIME AUTO-PRECHARGE CONTROL

(75) Inventors: Victor Wong, Boise, ID (US); Alan Wilson, Boise, ID (US); Christopher K. Morzano, Boise, ID (US)

(73) Assignee: Micron Technology, Inc., Boise, ID (US)

(*) Notice: Subject to any disclaimer, the term of this patent is extended or adjusted under 35 U.S.C. 154(b) by 115 days.

(21) Appl. No.: 12/112,887

(22) Filed: Apr. 30, 2008

(65) Prior Publication Data

US 2009/0273989 A1    Nov. 5, 2009

(51) Int. Cl.
*G11C 8/18* (2006.01)

(52) U.S. Cl. ......... 365/233.16; 365/233.12; 365/233.13; 365/230.03; 365/230.08; 365/189.12; 365/240; 365/203

(58) Field of Classification Search ............. 365/230.03, 365/233.1, 203, 189.12, 240, 230.08, 233.12, 365/233.13, 233.16
See application file for complete search history.

(56) References Cited

U.S. PATENT DOCUMENTS

| | | | |
|---|---|---|---|
| 5,187,779 A * | 2/1993 | Jeddeloh et al. | 710/315 |
| 5,671,392 A * | 9/1997 | Parris et al. | 711/148 |
| 5,805,931 A | 9/1998 | Morzano et al. | |
| 6,434,082 B1 * | 8/2002 | Hovis et al. | 365/233.16 |
| 6,446,180 B2 | 9/2002 | Li et al. | |
| 6,486,713 B2 | 11/2002 | Wright et al. | |
| 6,603,704 B2 | 8/2003 | Wilson | |
| 6,615,331 B1 | 9/2003 | Morzano | |
| 6,691,214 B1 | 2/2004 | Li et al. | |
| 6,791,370 B1 | 9/2004 | Morzano | |
| 6,920,524 B2 * | 7/2005 | Lovett | 711/106 |
| 6,922,367 B2 | 7/2005 | Morzano | |
| 7,054,222 B2 | 5/2006 | Li et al. | |
| 7,116,133 B2 | 10/2006 | Morzano | |
| 7,165,185 B2 | 1/2007 | Li et al. | |
| 7,215,579 B2 | 5/2007 | Janzen et al. | |
| 7,227,812 B2 | 6/2007 | Li et al. | |
| 7,236,385 B2 | 6/2007 | Thompson et al. | |
| 7,263,013 B2 * | 8/2007 | Kim | 365/203 |
| 7,280,410 B2 | 10/2007 | Janzen et al. | |
| 7,362,619 B2 | 4/2008 | Morzano et al. | |
| 7,443,747 B2 * | 10/2008 | Lien et al. | 365/203 |
| 7,486,574 B2 * | 2/2009 | Yang et al. | 365/191 |
| 2001/0044888 A1 | 11/2001 | Li et al. | |
| 2006/0187740 A1 | 8/2006 | Janzen et al. | |
| 2006/0233033 A1 * | 10/2006 | Park | 365/203 |

* cited by examiner

*Primary Examiner* — Andrew Q Tran
(74) *Attorney, Agent, or Firm* — Fletcher Yoder

(57) ABSTRACT

Methods of operating a memory device and memory devices are provided. For example, a method of operating a memory array is provided that includes a synchronous path and an asynchronous path. A Write-with-Autoprecharge signal is provided to the synchronous path, and various bank address signals are provided to the asynchronous path. In another embodiment, the initiation of the bank address signals may be provided asynchronously to the assertion of the Write-with-Autoprecharge signal.

15 Claims, 5 Drawing Sheets

SYNCHRONOUS COMMAND-BASED WRITE RECOVERY TIME AUTO-PRECHARGE CONTROL

BACKGROUND

1. Field of the Invention

Embodiments of the present invention relate generally to memory devices and more specifically to the processing of signals in high speed memory arrays.

2. Description of the Related Art

Electronic systems and devices, such as computers, personal organizers, cell phones, portable audio players, etc., typically include one or more memory devices to provide storage capability for the system. System memory is generally provided in the form of one or more integrated circuit chips and generally includes both random access memory (RAM) and read-only memory (ROM). System RAM is typically large and volatile and provides the system's main memory. Synchronous Dynamic RAM (SDRAM) is a commonly employed type of random access memory.

As will be appreciated, there are a number of different types of SDRAM devices. Early generation SDRAM devices are generally configured such that data from the memory cells may be accessed and one bit of data may be output on every clock cycle. Demands for higher processing speeds led to the development of Double Data Rate (DDR) SDRAM devices. DDR SDRAM devices generally allow for two bits of data to be accessed and output on every clock cycle. To achieve this, DDR SDRAM devices commonly clock data out on every rising and every falling edge of the clock signal.

Typically, the memory cells of a DDR SDRAM memory array are arranged in banks in the array with each cell having an address identifying its location in the array. The array includes a configuration of intersecting rows and columns and a memory cell is associated with each intersection. In order to read from or write to a cell, the particular cell and bank must be selected (addressed). The address for a selected bank is represented by input signals to bank control logic, which may select a bank in response to a particular address. The bank address signals for a conventional configuration of 8 memory banks include three bank address signals, with each combination of signals corresponding to a specific bank. For each operation executed to a bank, the appropriate bank address signals are used to identify the bank. Similarly, to select a cell, a row address and column address may be provided. A row decoder activates a wordline in response to the row address, and a column decoder activates a column decoder output in response to the column address.

Various signals may be used to operate the memory array. For example, a precharge signal may be sent to the memory array to deactivate a row or bank of memory cells before or after a previous or subsequent operation. In some implementations, a Write-with-Autoprecharge command may be given as a write command that automatically performs a precharge operation after completion of the write operation.

In some types of DRAM, such as DDR2 and DDR3, the specification may provide guidelines for the timing of the precharge command. For example, a Write (data) Recovery time (tWR) may be specified. Generally, tWR is referred to as the time necessary to store data into a memory cell before a precharge can occur. More specifically, tWR is the minimum time to guarantee that data in the write buffer can be fully written into a memory cell. If tWR is not satisfied, e.g., if tWR is not sufficiently long enough to store data in a memory cell, then the full data is not stored and a read failure can result.

As memory chips and devices using memory chips become smaller, size of the memory chips and associated logic circuitry, as well as power consumption, may be of increasing importance. Accordingly, it may be desirable to reduce the logic required for tWR precharge circuits for a memory array.

Embodiments of the present invention may be directed to one or more of the problems set forth above.

DETAILED DESCRIPTION OF SPECIFIC EMBODIMENTS

Figure 1:
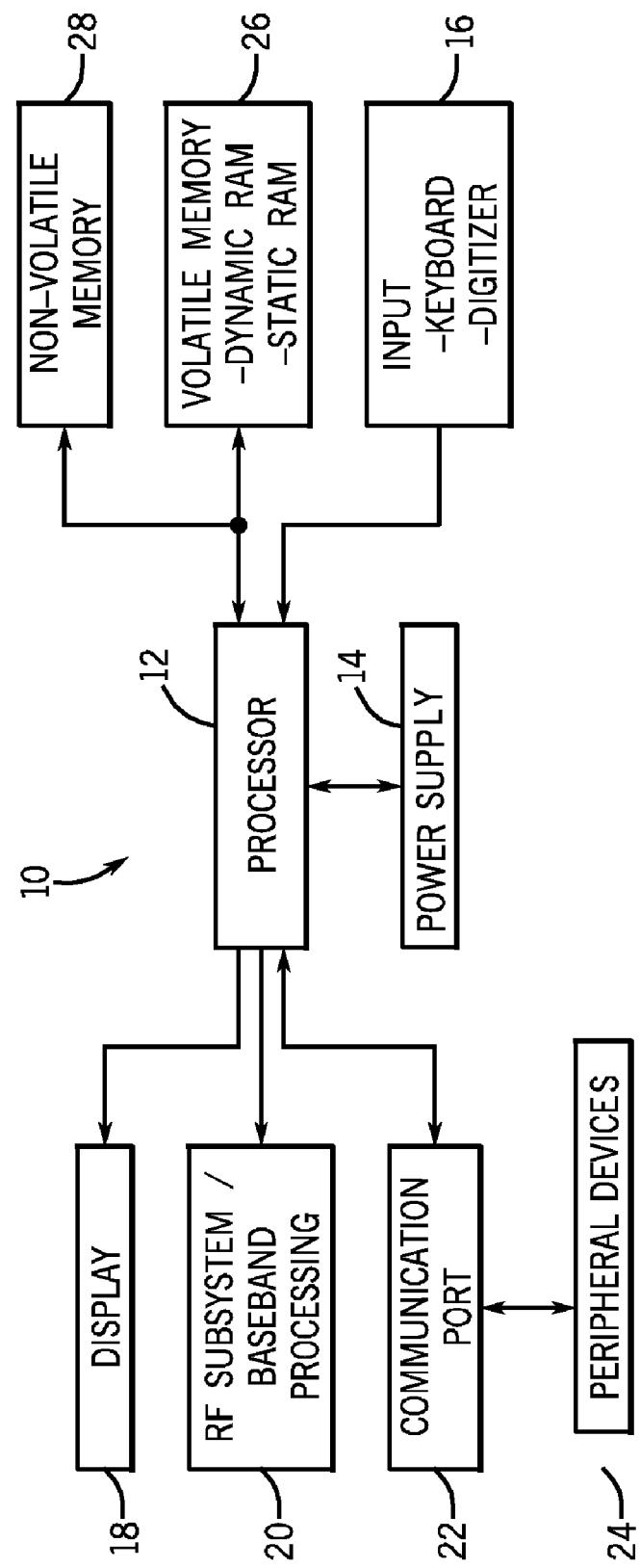
FIG. 1 illustrates a block diagram of a processor-based device having a memory device in accordance with embodiments of the present invention.

Turning now to the drawings, and referring initially to FIG. 1, a block diagram depicting an embodiment of a processor-based system, generally designated by reference numeral 10, is illustrated. The system 10 may be any of a variety of types such as a computer, pager, cellular phone, personal organizer, portable audio player, control circuit, camera, etc. In a typical processor-based device, a processor 12, such as a microprocessor, controls the processing of system functions and requests in the system 10. Further, the processor 12 may comprise a plurality of processors that share system control.

The system 10 typically includes a power supply 14. For instance, if the system 10 is a portable system, the power supply 14 may include permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a stylus, a mouse, and/or a voice recognition system, for instance. A display 18 may also be coupled to the processor 12. The display 18 may include an LCD, a CRT, LEDs, and/or an audio display, for example.

Furthermore, an RF sub-system/baseband processor 20 may also be coupled to the processor 12. The RF sub-system/baseband processor 20 may include an antenna that is coupled to an RF receiver and to an RF transmitter (not shown). A communications port 22 may also be coupled to the processor 12. The communications port 22 may be adapted to be coupled to one or more peripheral devices 24 such as a modem, a printer, a computer, or to a network, such as a local area network, remote area network, intranet, or the Internet, for instance.

Because the processor 12 controls the functioning of the system 10 by implementing software programs, memory is used to enable the processor 12 to be efficient. Generally, the memory is coupled to the processor 12 to store and facilitate execution of various programs. For instance, the processor 12 may be coupled to volatile memory 26, which may include volatile memory, such as Dynamic Random Access Memory (DRAM), Double Data Rate (DDR) DRAM, and/or Static Random Access Memory (SRAM). The processor 12 may also be coupled to non-volatile memory 28. The non-volatile memory 28 may include a read only memory (ROM), such as an EPROM or Flash Memory, to be used in conjunction with the volatile memory. Additionally, the non-volatile memory 28 may include a high capacity memory such as a disk drive, tape drive memory, CD ROM drive, DVD, read/write CD ROM drive, and/or a floppy disk drive.

The volatile memory 26 may include a number of SDRAMs which may implement DDR, DDR2, DDR3, or other technology. The SDRAM differs from a DRAM in that the SDRAM is controlled synchronously with a timing source, such as the system clock. To accomplish synchronous control, latches are used to provide data and other information on the inputs and outputs of the SDRAM. Thus, in a read operation for example, the processor 12 may access a data output latch after a specific number of clock cycles after issuing the read request. The number of clock cycles typically corresponds to the amount of time needed to access the requested data, move the data to the output latch, and allow the data to stabilize. The data is clocked out of the output latch synchronous with the system clock which provides the timing source for the processor 12. Synchronization of the data read from the output latch with the system clock is generally implemented via a delay locked loop (DLL) circuit. In general, the DLL locks the data output signal to the system clock by shifting the output data in time such that it is nominally aligned with the system clock. Thus, the DLL can compensate for timing delays introduced by various components in the SDRAM.

As described further below, write operations also are performed synchronously (e.g., in synchronization) with a timing source, such as the system clock or other externally provided timing source. Thus, data may be clocked into an input latch and written to the memory array under control of a write clock provided from the external device which is performing the write operation.

Figure 2:
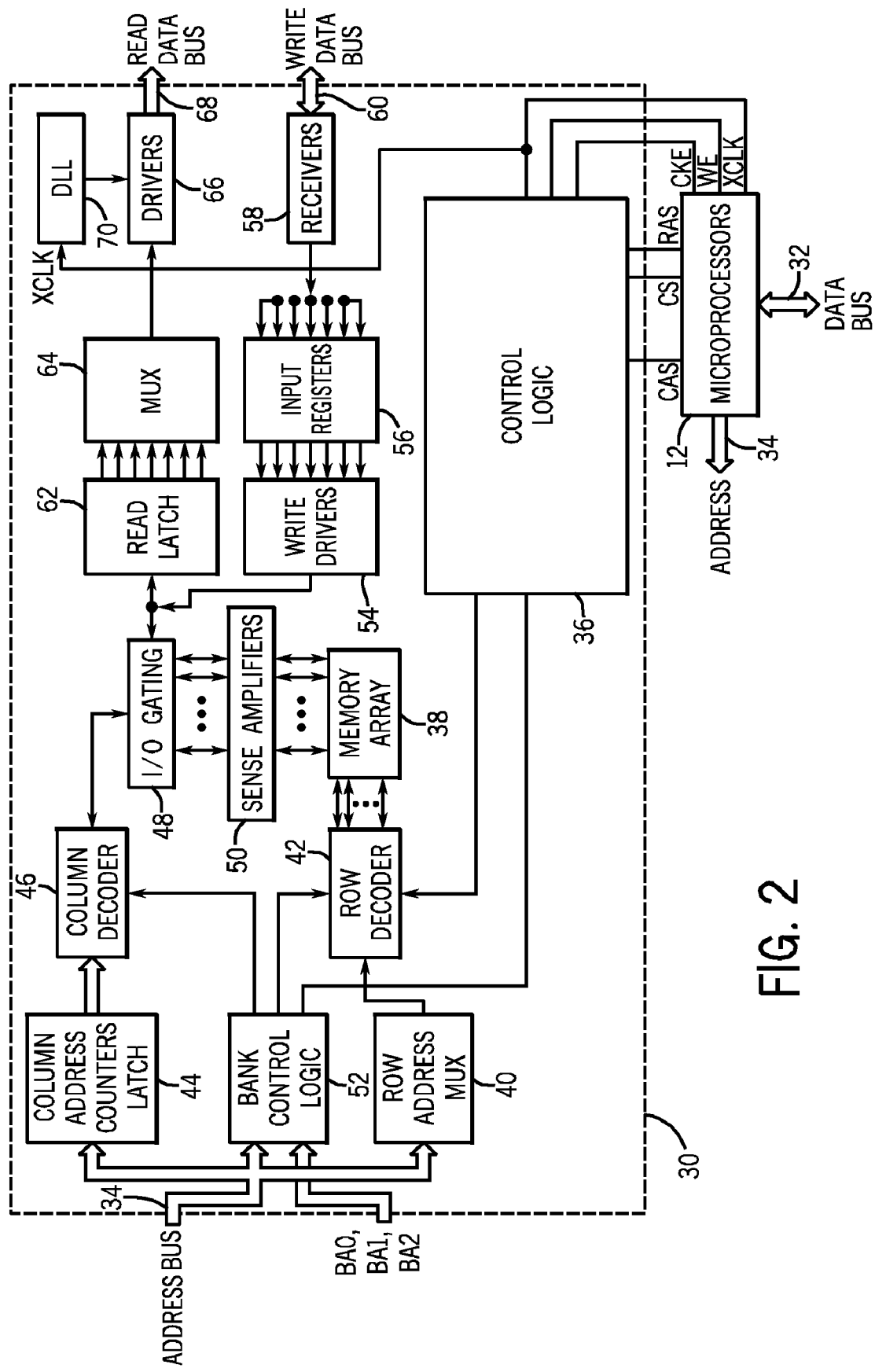
FIG. 2 illustrates a block diagram of a memory device in accordance with embodiments of the present invention.

Turning now to FIG. 2, a block diagram depicting an exemplary embodiment of an SDRAM 30 is illustrated, such as DDR3 SDRAM, for example. The present technique may not be limited to DDR3 SDRAM, and may be applicable to other synchronous memory devices, and particularly to other high speed memory devices and other devices for use in communication applications. Those skilled in the art will recognize that various devices may be used in the implementation of the present invention. As will be appreciated, the description of the SDRAM 30 has been simplified for illustrative purposes and is not intended to be a complete description of all features of an SDRAM.

Control, address, and data information provided over a memory bus are represented by individual inputs to the SDRAM 30. These individual representations are illustrated by a data bus 32, address lines 34, and various discrete lines directed to control logic 36. As will be appreciated, the various buses and control lines may vary depending on the system. As is known in the art, the SDRAM 30 includes a memory array 38 which comprises memory banks having rows and columns of addressable memory cells. It should be appreciated that the terms row and column are not meant to imply a particular orientation or linear relationship, but are more generally meant to refer to a logical relationship between one another. A row comprises a plurality of memory cells that are commonly coupled in such a way that they can be accessed at substantially the same time. In one embodiment, the memory cells include an access transistor, where a row of memory cells are those transistors having their control gates commonly coupled. These commonly coupled control gates can collectively form an "access line", which is commonly referred to in the art as a "word line", or they can be commonly coupled to a separate conductive line, which could also be considered an access line (e.g., a word line). A column, on the other hand, refers to those memory cells that are commonly coupled to a data line, which is commonly referred to in the art as a digit line (e.g., a bit line). Each cell in the memory array 38 typically includes a storage capacitor and an access transistor as is conventional in the art.

The SDRAM 30 interfaces with, for example, a microprocessor 12 through address lines 34 and data lines 32. Alternatively, the SDRAM 30 may interface with other devices, such as an SDRAM controller, a microcontroller, a chip set, or other electronic system. The microprocessor 12 also may provide a number of control signals to the SDRAM 30. Such signals may include row and column address strobe signals RAS and CAS, chip select signal CS, a write enable signal WE, a clock enable signal CKE, an external clock signal XCLK, and other conventional control signals. The control logic 36 controls the many available functions of the SDRAM 30. In addition, various other control circuits and signals not detailed herein contribute to the operation of the SDRAM 30, as known to one of ordinary skill in the art.

A row address multiplexer 40 and a row decoder 42 receive and decode row addresses from row address signals provided on the address lines 34. Each unique row address corresponds to a row of cells in the memory array 38. The row decoder 42 typically includes a word line driver, an address decoder tree, and circuitry which translates a given row address received from row address buffers 40 and selectively activates the appropriate word line of the memory array 38 via the word line drivers.

A column address counter/latch 44 and a column decoder 46 receive and decode column address signals provided on the address lines 34. The column decoder 46 may also determine when a column is defective, as well as the address of a replacement column. The column decoder 46 is coupled to I/O gating 48, which is in turn coupled to sense amplifiers 50. The sense amplifiers 50 are coupled to complementary pairs of bit lines of the memory array 38. Additionally, bank control logic 52 receives and decodes bank address signals BA0, BA1, BA2, etc., provided on the address lines 34. The bank control logic 52 outputs a bank signal to the column decoder 46 and the row decoder 42, indicating banks of the memory array 38.

The I/O gating 48 is coupled to data-in (i.e., write) and data-out (i.e., read) circuitry. The data in circuitry may comprise write drivers 54, input registers 56, and receivers 58 configured to receive write data. The write drivers 54, input registers 56, and receivers 58 are configured to receive external write data serially, and convert the serial write data to parallel data for storage in the memory array 38. During a write operation, the write data bus 60 provides data to the receivers 58. As will be appreciated, the write data bus 60 is part of the databus 32. The I/O gating 48 receives data from the write driver 54 and stores the data in the memory array 38 as a charge on a capacitor of a cell at an address specified on the address line 34.

During a read operation, the SDRAM 30 transfers data to the microprocessor 12 from the memory array 38. Complementary bit lines for the accessed cell are equilibrated to a reference voltage provided by an equilibration circuit and a reference voltage supply. The charge stored in the accessed cell is then shared with the associated bit lines. The sense amplifier 48 detects and amplifies a difference in voltage between the complementary bit lines. Address information received on address lines 34 selects a subset of the bit lines and couples them to complementary pairs of input/output (I/O) lines (e.g., wires). The I/O wires pass the amplified voltage signals to the data-out circuitry, such as read latch 62, multiplexer 64, and drivers 66. The read latch 62 is configured to receive data from the I/O gating 48 and to transmit the data in parallel to a multiplexer 64 which serializes the data to read data bus 68. As with the write data bus 60, the read data bus 68 is a high speed data bus configured to operate at 400 MHz or higher. The timing source for the read drivers 66 may be provided by a delay locked loop (DLL) circuit 70 which provides a shifted clock signal (DLLCK) which is synchronous with the external system clock signal (XCLK), thus locking the output data signal on the read data bus 68 to the system clock XCLK.

Figure 3:
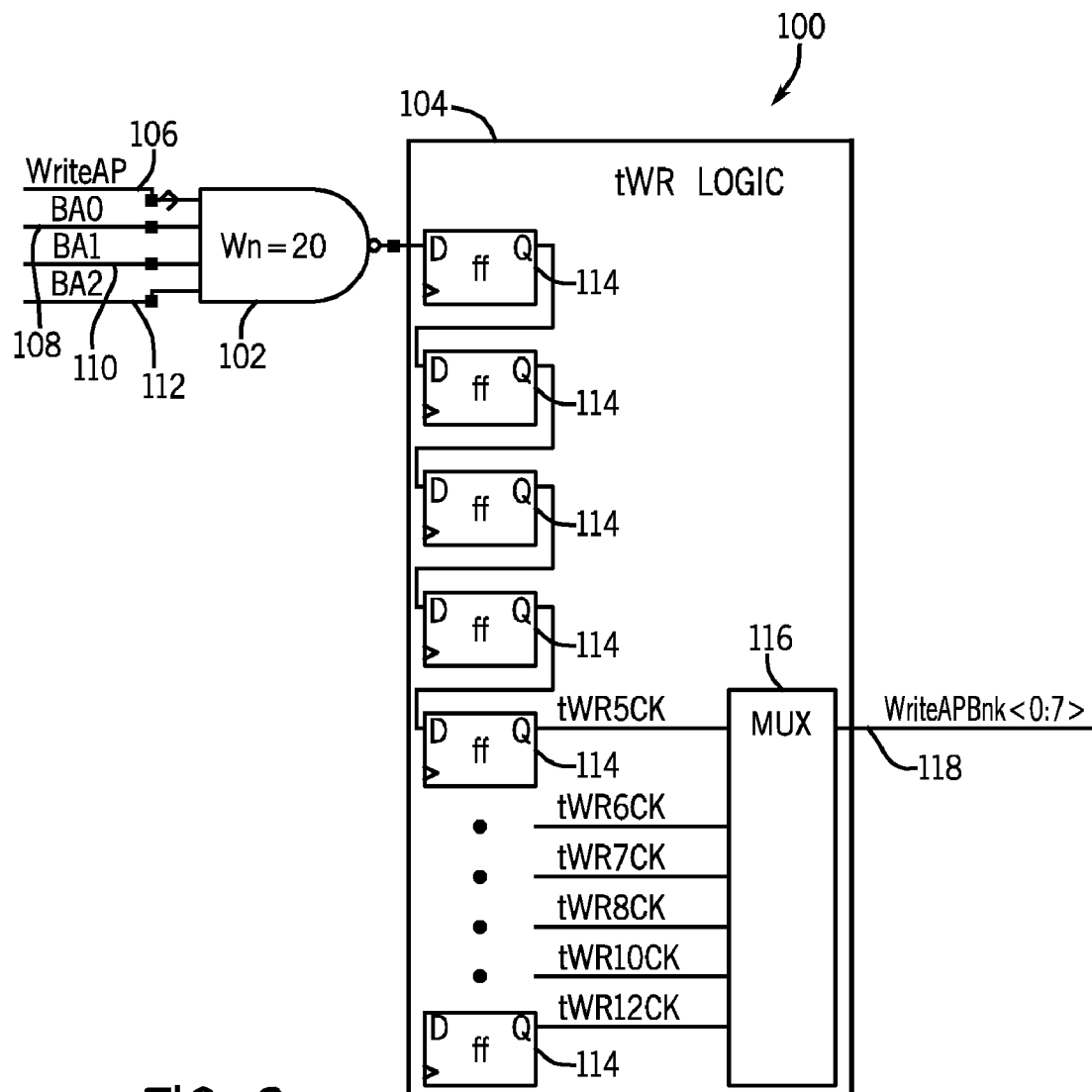
FIG. 3 is a logic diagram of a conventional tWR precharge circuit for a memory array.

FIG. 3 is a diagram of a conventional tWR precharge circuit 100 for a memory array, such as may be implemented as part of the control logic 36 and/or bank control logic 52 of the SDRAM 30 of FIG. 2. As will be explained further below, an implementation of the conventional tWR precharge circuit 100 requires a circuit 100 for each memory bank. For example, for a memory array comprising eight banks, eight tWR precharge circuits 100 are required. The circuit 100 includes a decoder 102, such as NAND gate, and tWR logic 104 for processing the decoded signals. The inputs to the decoder 102 may include a Write-with-Autoprecharge (WriteAP) signal 106, bank address signal (BA0) 108, bank address signal (BA1) 110, and bank address signal (BA2) 112. The output from the decoder 102 is provided to the tWR logic 104.

The tWR logic 104 implements the logic necessary to ensure the elapse of the specific tWR duration for memory array. For example, as discussed above, specifications for types of SDRAM, such as DDR2 and DDR3, may include a specific minimum tWR value. To count the specific clock cycles for tWR, the tWR logic may include a plurality of registers 114, such as serial shift registers (flip flops). The circuit 100 may include the registers 114 necessary to count the clocks for the WriteAP signals a specific bank. For example, various WriteAP signals may be output after the specified clock duration, as indicated by the signals tWR5CK, tWR6CK, etc. This clock duration corresponds to the tWR duration for the signal. After the tWR count, the output from the registers 114, e.g. the WriteAP signals after tWR, are provided to a multiplexer 116. The multiplexer 116 outputs the received signals to a WriteAPBank signal (WriteAPBnk<0:7>) 118.

As mentioned above, in a memory array using the conventional tWR precharge circuit 100, each bank in the array will require a tWR precharge circuit 100 to provide the necessary precharge timing and tWR. For example, a memory array with 8 banks will require 8 tWR precharge circuits 100, each having the requisite number of registers 114. Such an implementation may be referred to as a "bank-based" design, as each bank requires its own precharge circuit. As described above, the Write-with-Autoprecharge signal 106 and the bank address signals 106, 108, and 110 for a bank are decoded together via decoder 102, and then passed through the registers 114 to provide the tWR duration. Thus, for each bank of a memory array, a tWR precharge circuit 100 provides the tWR for Write-with-Autoprecharge signals asserted to the bank.

Figure 4:
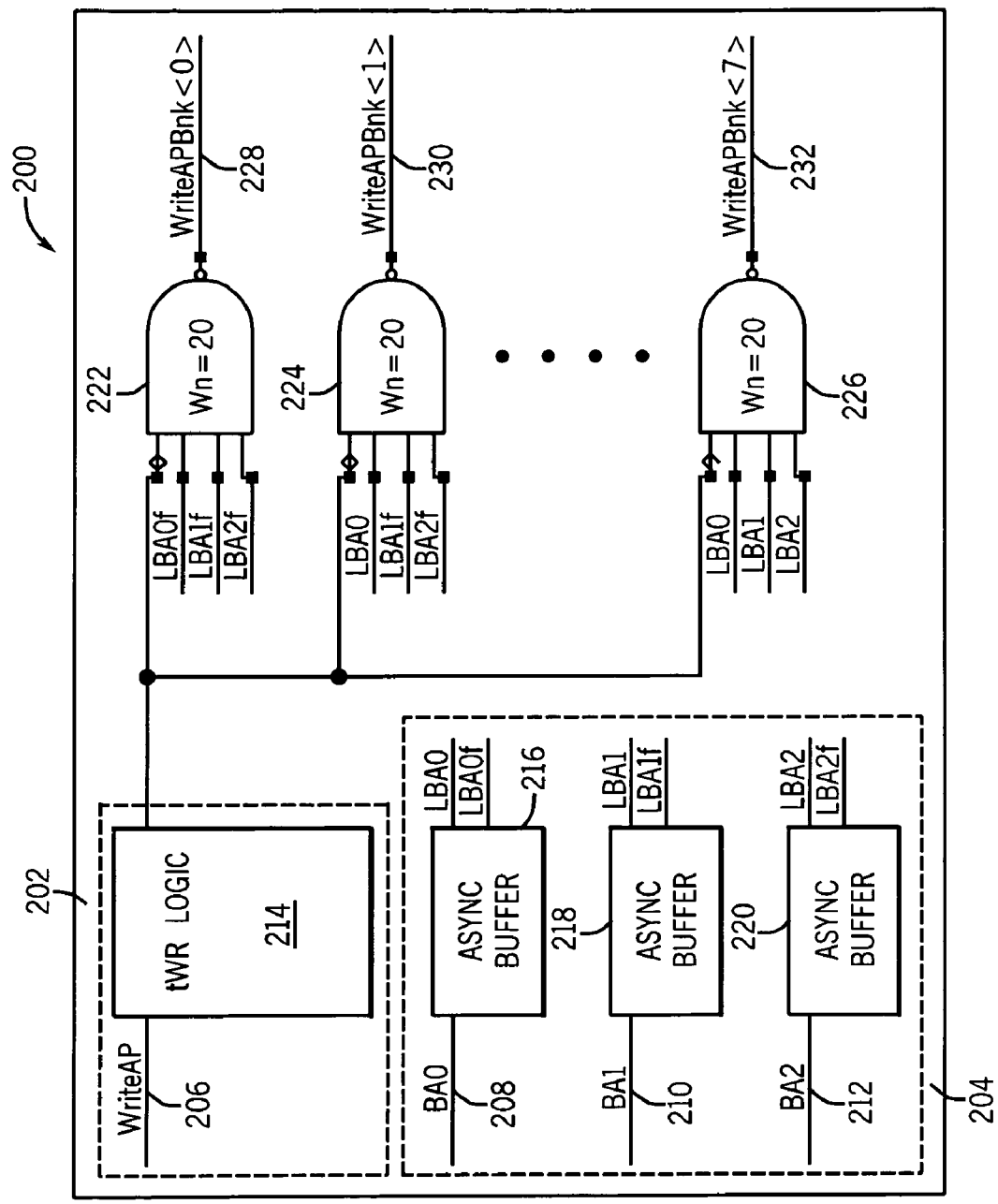
FIG. 4 is a logic diagram of a tWR precharge circuit having synchronous and asynchronous paths in accordance with an embodiment of the present invention.

In contrast to the circuit depicted in FIG. 3, FIG. 4 is a diagram of a "command based" tWR precharge circuit 200 in accordance with an embodiment of the present invention. As described further below, the tWR precharge circuit 200 includes a synchronous path 202 and an asynchronous path 204. The address signals are processed on an asynchronous path, which can reduce the number of latches and eliminate clock loading. The WriteAP signal remains on a synchronous path to provide the tWR function. Because of the separation of the address signals into an asynchronous path, the WriteAP signal path (synchronous path) is the only path that uses the registers to meet a write recovery (tWR) specification and provide a tWR duration. Because the address signals are on an asynchronous path, the registers used to meet any write recovery (tWR) specification, i.e. provide a tWR duration, may be removed.

Turning now in detail to FIG. 4, the tWR precharge circuit 200 receives a Write-with-Autoprecharge signal (WriteAP) 206, a bank address 0 (BA0) signal 208, a bank address 1 (BA1) signal 210, and a bank address 2 (BA2) signal 212. As mentioned above, the WriteAP signal 206 is provided to a synchronous path that includes tWR logic 214. The tWR logic 214 may include registers, e.g. flip flops, to provide any tWR duration. In contrast, the bank address signals 208, 210, and 212 are provided to an asynchronous path 204. In an embodiment, the synchronous path 202 uses no additional buffers, wherein it's natural shift register operations allows the storage of consecutive WriteAP commands. For example, the 2nd WriteAP commands will not overwrite or collide with the 1st WriteAP commands, as they will be sequentially shifted through the synchronous registers as depicted in FIG. 3. The asynchronous path 204 may use additional buffers, such as buffers 216, 218, and 220, and control logic to store the 2nd bank addresses associated with the 2nd WriteAP commands. These buffers allow the current and old bank addresses to be stored while waiting out the tWR duration of the past WriteAP commands.

As described below, upon receiving a command from the tWR logic 214, the buffers 216, 218, and 220 may output a latched bank address signal and the corresponding opposite polarity signal. For example, the buffer 216 receives the BA0 signal 208 and outputs latched signal LBA0 and opposite polarity signal LBA0f. Buffer 218 receives BA1 signal 210 and outputs latched signals LBA1 and opposite polarity signal LBA1f. Additionally, buffer 220 receives BA2 signal 212 and outputs latched signals LBA2 and opposite polarity signal LBA2f.

Upon initiation of a Write-with-autoprecharge operation, tWR logic 214 receives the WriteAP signal 206. The output from the tWR logic 214 may be decoded to determine the appropriate bank address signals generated via the asynchronous buffers 216, 218, and 220. The signals for the Write-with-Autoprecharge operation may be decoded after the synchronous path 202 (tWR logic 214) and decoders 222, 224, 226, etc. For example, in an embodiment a first decoder 222 may receive the output from the tWR logic 214, and may receive the LBA0f signal, the LBA1f signal, and the LBA2f signal indicating the target bank for the command, bank 0. The decoder 222 may then output a decoded Write-with-Autoprecharge Bank signal (WriteAPBnk<0>) 228 for bank 0. Similarly a second decoder 224 may receive the output from tWR logic 214, and the LBA0 signal, the LBA1f signal, and the LBA2f signal indicating bank 2, and output a Write-with-Autoprecharge Bank signal (WriteAPBnk<1>) 230. Additional decoders may be included for each memory bank, as indicated by decoder 226 and corresponding output Write-with-Autoprecharge Bank signal WriteAPBnk<7> 232.

Figure 5:
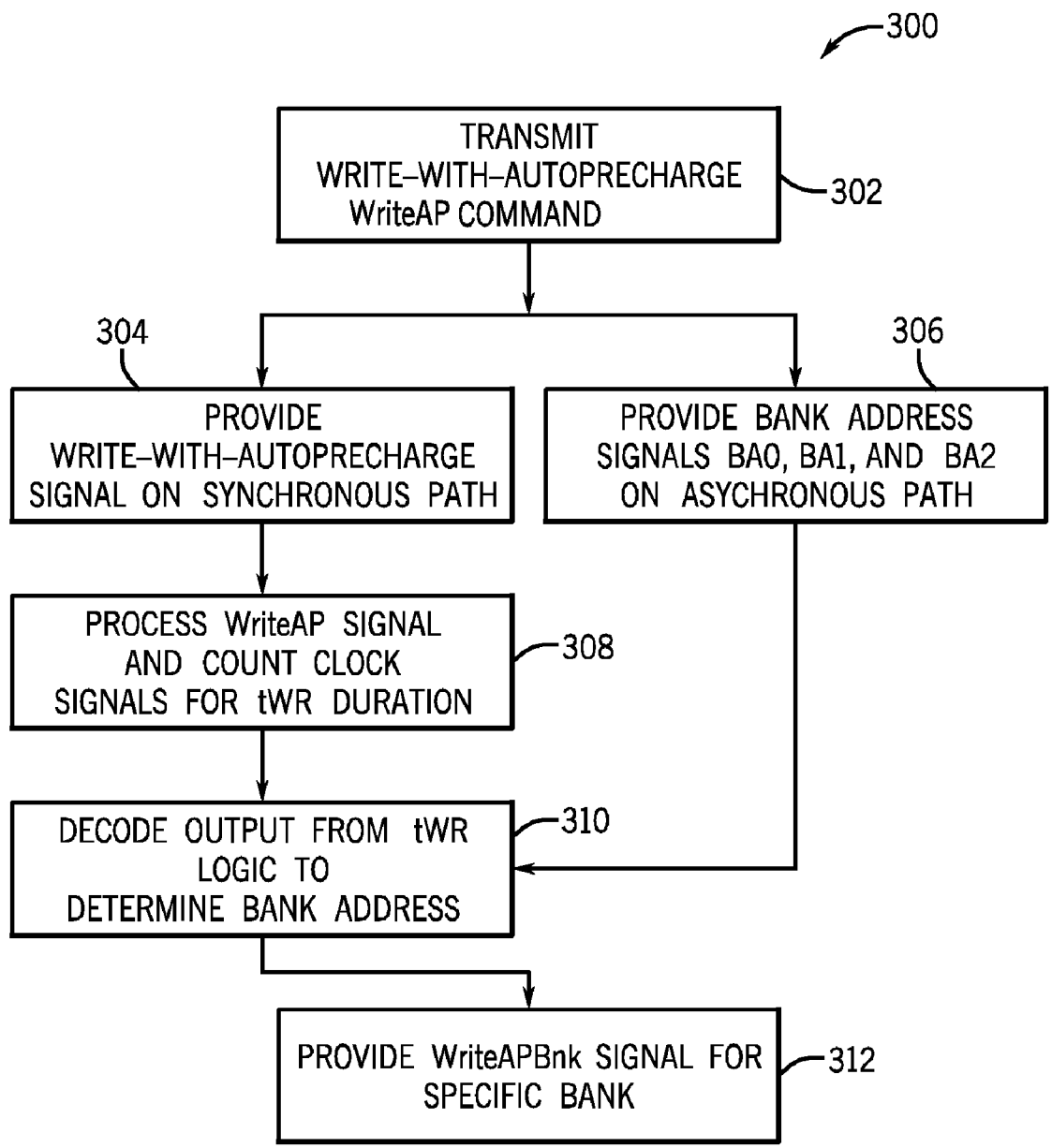
FIG. 5 is a flowchart illustrating the processing of a Write-with-Autoprecharge command according to an embodiment of the present invention.

FIG. 5 depicts a process 300 illustrating the operation of the command based tWR precharge circuit 200 according to an embodiment of the present invention. Initially, a Write-with-autoprecharge (WriteAP) command may be transmitted to the control logic for the memory array (block 302). As discussed above, a WriteAP signal may be provided to a synchronous path that includes tWR logic (block 304). The bank address signals BA0, BA1, and BA2 may be provided to an asynchronous path that does not include any registers for counting clock cycles to ensure a tWR duration (block 306). In contrast, the synchronous path may include tWR logic having a plurality of registers configured to count for the specific clock cycles needed for a specific tWR duration. In this manner the WriteAP signal is processed (block 308). After the WriteAP signal has been processed, the output from the tWR logic and the appropriate bank address signals are decoded to determine the bank address for the command (block 310). After decoding, the bank WriteAP signal (WriteAPBnk) may be provided to a specific bank (block 312), resulting in execution of the WriteAP operation for that bank.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of operating a memory array, comprising:
providing a first signal to a synchronous path, wherein the synchronous path comprises logic to provide a write recovery time (tWR) and;
providing at least one or more second signals to an asynchronous path, wherein the at least one or more second signals comprises an address signal,
wherein the first signal is not provided to the asynchronous path.

2. The method of claim 1, wherein the first signal comprises a Write-with-Autoprecharge signal.

3. The method of claim 1, wherein the at least one or more second signals comprise a first bank address signal, a second bank address signal, and a third bank address signal.

4. The method of claim 1, wherein providing a first signal comprising latching the first signal to a clock signal.

5. The method of claim 1, further comprising decoding the first signal and the one or more second signals.

6. The method of claim 5, wherein decoding comprises providing the first signal and the at least one or more second signals to a NAND gate.

7. The method of claim 1, further comprising processing the first signal through a plurality of registers in the synchronous path, wherein the registers are configured to process the first signal for a specific duration, wherein the specific duration comprises the tWR.

8. The method of claim 1, further comprising providing a third signal to the asynchronous path.

9. The method of claim 1, further comprising providing a decoded Write-with-Autoprecharge signal to a bank of the memory array.

10. A method of operating a memory array, comprising:
providing a first Write-with-Autoprecharge signal;
providing a bank address signal, wherein the providing is asynchronous to providing the first Write-with-Autoprecharge signal.

11. The method of claim 10, comprising storing the bank address signal in a buffer.

12. The method of claim 10, comprising decoding the first Write-with-Autoprecharge signal and the bank address signal.

13. The method of claim 12, comprising outputting a decoded Write-with-Autoprecharge signal for a specific bank of the memory array.

14. A method of operating a memory array, comprising:
providing a first Write-with-Autoprecharge signal;
providing a bank address signal, wherein the providing is asynchronous to providing the first Write-with-Autoprecharge signal; and
providing a second Write-with-Autoprecharge signal, such that the second Write-with-Autoprecharge signal is shifted for a duration of the first Write-with-Autoprecharge signal, and the bank address signal is stored in a buffer for the duration of the first Write-with-Autoprecharge signal.

15. The method of claim 14, wherein the duration comprises a Write Recovery time.

* * * * *